United States Patent [19]

Konda

[11] Patent Number: 4,682,203
[45] Date of Patent: Jul. 21, 1987

[54] SOLID-STATE IMAGE PICKUP DEVICE WITH PHOTOGRAPHIC SENSITIVITY CHARACTERISTICS

[75] Inventor: Ryuji Konda, Kaisei, Japan

[73] Assignee: Fuji Photo Film Co., Ltd., Kawagawa, Japan

[21] Appl. No.: 766,335

[22] Filed: Aug. 16, 1985

[30] Foreign Application Priority Data

Aug. 23, 1984 [JP] Japan .................. 59-174158

[51] Int. Cl.[4] .............................. H01L 27/02
[52] U.S. Cl. ............................ 357/51; 357/30
[58] Field of Search ......................... 357/30, 51

[56] References Cited

U.S. PATENT DOCUMENTS 4,143,389 3/1979 Koike et al. ................. 357/30

FOREIGN PATENT DOCUMENTS 58-105672 6/1983 Japan ........................ 357/30
58-181371 10/1983 Japan .

*Primary Examiner*—Andrew J. James
*Assistant Examiner*—Mark Prenty
*Attorney, Agent, or Firm*—Birch, Stewart, Kolasch & Birch

[57] ABSTRACT

A solid-state image pickup device having photosensitive cells disposed on a semiconductor substrate of a first conductivity type. The photosensitive cells include phototransistors for generating photocarriers associated with light incident thereto to store the photocarriers generated therein, and readout gates connected to one electrode of the phototransistors for reading out in the form of video signal the photocarriers stored in the phototransistors. The photosensitive cells are arranged in a principal surface of the semiconductor substrate. The photosensitive cells further include capacitors disposed in the principal surface and connected to the other electrodes of the phototransistors.

9 Claims, 8 Drawing Figures

SOLID-STATE IMAGE PICKUP DEVICE WITH PHOTOGRAPHIC SENSITIVITY CHARACTERISTICS

BACKGROUND OF THE INVENTION

1. Field of the Invention

The present invention relates to a solid-state image pickup device, and in particular, to a solid-state image pickup device in which photosensitive cells are arranged in a one-dimensional or two-dimensional array.

2. Description of the Prior Art

There has been conventionally developed an amplification-type of solid-state image pickup device which includes a phototransistor functioning as a photosensitive cell and an IGFET serving as a read circuit serially connected to the phototransistor. For example, in a solid-state pickup device disclosed in the Japanese Patent Laid-Open Publication No. 181371/1983, photocarriers generated in a base region of a phototransistor in response to light incident thereto flow into a source region of an IGFET functioning also as a collector, for example, to be stored therein. In this case, by virtue of the current amplification of the phototransistor, the electric charges resultant from multiplying the photocarriers flowing from the base to the collector by its amplification factor are stored in the source region. When the gate of IGFET is opened, the stored charges can be read in the form of a signal current associated with the photocarriers.

Such an image pickup device is characterized by functioning to amplify the readout current. However, it is necessary to include a contact forming an emitter electrode of the phototransistor, which is not suitable for manufacturing an integrated photosensitive cell array with a higher pixel density. In addition, the amplifying function is developed in response to a strong incident light in a manner similar to a weak incident light. Consequently, in an image pickup device having such an amplification characteristic, it is impossible to realize a dynamic range for implementing so-called photographic characteristics in which sensitivity is higher with a lower intensity of illumination and lower with higher intensity.

SUMMARY OF THE INVENTION

It is therefore an object of the present invention to provide a solid-state image pickup device which overcomes the prior art disadvantages described above and which develops a broader dynamic range.

In accordance with the present invention, there is provided a solid-state image pickup device having photosensitive cells disposed on a semiconductor substrate of a first conductivity type, wherein each of the photosensitive cells includes phototransistor means for generating photocarriers associated with light incident thereto to store the photocarriers generated therein, and readout gate means connected to one electrode of said phototransistor means for reading out in the form of video signal the photocarriers stored in said phototransistor means; said photosensitive cells being arranged in a principal surface of said semiconductor substrate; each of said photosensitive cells further including capacitor means disposed in said principal surface and connected to the other electrode of said phototransistor means.

In accordance with an aspect of the present invention, said phototransistor means includes a first region of semiconductor material of a second conductivity type which is opposite to the first conductivity type; a second region of semiconductor material of the first conductivity type disposed in said first region for functioning as a base electrode of the phototransistor means; and a third region of semiconductor material of the second conductivity type disposed in said second region for functioning as an emitter electrode of the phototransistor means; said capacitor means including a layer of insulating material disposed on said third region and a layer of conductive material disposed on said layer of insulating material for functioning as one electrode of said capacitor means; said third region functioning as the other electrode of said capacitor means; said readout means including an IGFET in which said first region functions as one of source and drain electrodes thereof.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, embodiments of the solid-state image pickup device of the present invention will be described in detail.

Figure 1:
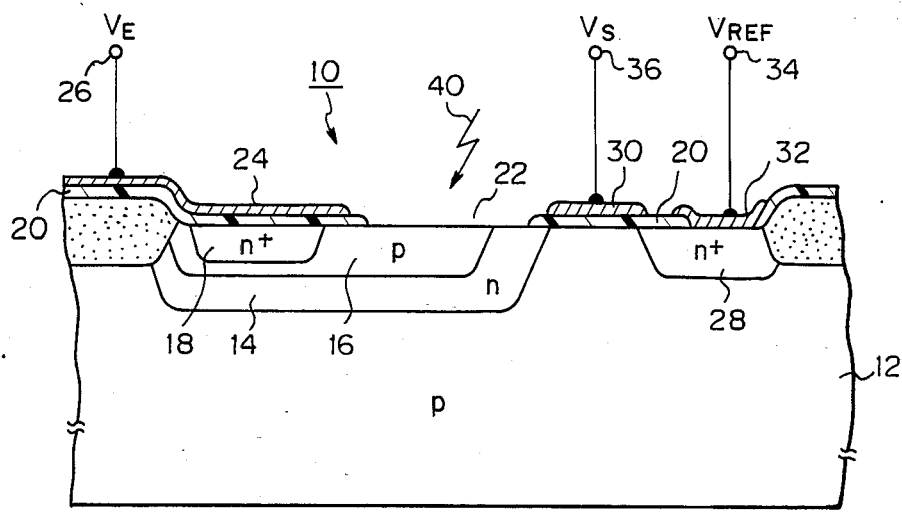
FIG. 1 is a schematic, cross-sectional view illustrating a photosensitive cell of an embodiment of a solid-state image pickup device in accordance with the present invention.

FIG. 1 illustrates a schematic diagram showing a cross-section of a photosensitive cell 10 in an embodiment of the solid-state image pickup device of the present invention. In this embodiment, the photosensitive cell 10 comprises an n-type region 14 formed in a principal surface of a p-type silicon substrate 12, a p-type region 16 formed in the n-type region 14, and an n+-type region 18 formed in the p-type region 16. In this structure, a phototransistor Q, FIG. 2, includes the n-type region 14 as a collector electrode, the p-type region 16 as a base electrode, and the n+-region as an emitter electrode. Obviously, the present invention is not limited by this embodiment, that is, it is also applicable to a phototransistor of the conductivity type opposite to the illustrative embodiment, namely, in the pnp configuration.

Excepting an opening 22 in the neighborhood of the pn junction region of the phototransistor Q, the principal surface of the substrate 12 is coated with an insulating layer 20. An electrode contact layer 24 of a conductive material such as metal is deposited on the insulating layer 20 formed in the n+-type region 18 so as to cover the insulating layer 20. This structure forms a capacitor C, FIG. 2, including the insulating layer 20 for storing electric charges. The electrode is 24 connected to a terminal 26, which is supplied with a reference voltage $V_E$. The voltage $V_E$ may be the ground potential in this embodiment.

On the other hand, as shown in the figure, an n+-type region 28 opposing to the n-type region 14 is disposed in the same principal surface of the substrate 12. The principal surface of the substrate material 12 between the n-type region 14 and the n+-type region 28 is coated with the insulating layer 20 having a metal electrode 30 formed thereon. The metal electrode is 30 connected to a terminal 36, which is supplied with a readout voltage $V_S$. This MOS structure constructs an IGFET S, FIG. 2, including the n-type region 14 as a source, the n+-type region 28 as a drain, and the electrode 30 as a gate electrode. The drain region 28 is connected via a drain electrode contact 32 to a terminal 34, which is supplied with another positive reference voltage $V_{REF}$, of 3 to 5 volts, for example. Obviously, the present invention is not limited by this embodiment, but applicable to an IGFET of the conductivity type opposite to the illustrative embodiment, namely, a p-channel IGFET.

Figure 2:
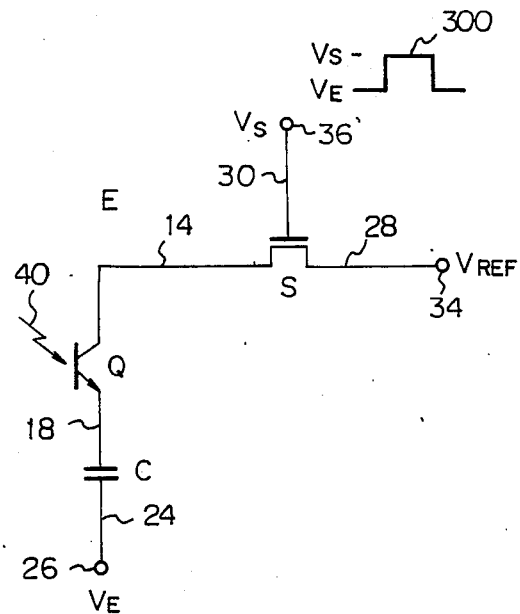
FIG. 2 is a schematic circuit diagram showing an equivalent circuit of the photosensitive cell of FIG. 1.

As shown in the equivalent circuit of FIG. 2, the photosensitive cell 10 of FIG. 1 has a circuit configuration in which the collector of the phototransistor Q is connected to the source of the IGFET S, and the emitter of the phototransistor Q is connected to the capacitor C.

Figure 5:
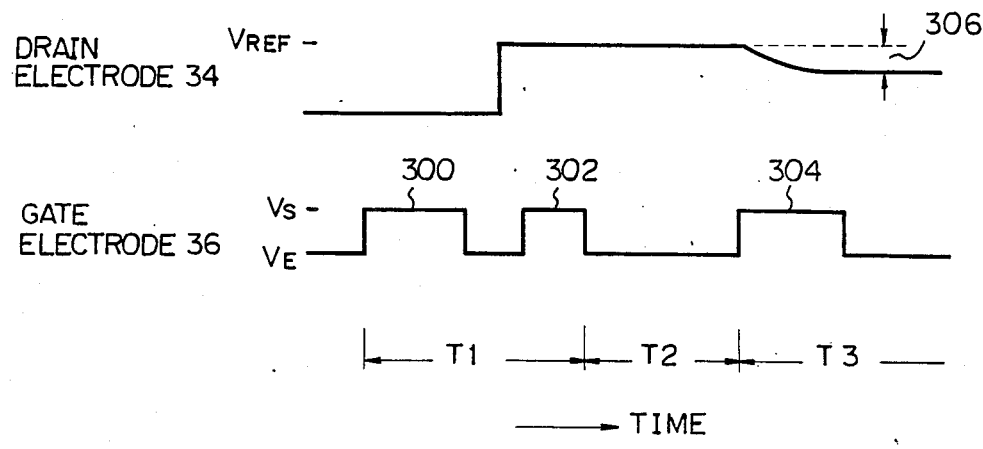
FIG. 5 is a schematic waveform diagram showing examples of pulses driving the photosensitive cell of FIG. 1.
Figure 7:
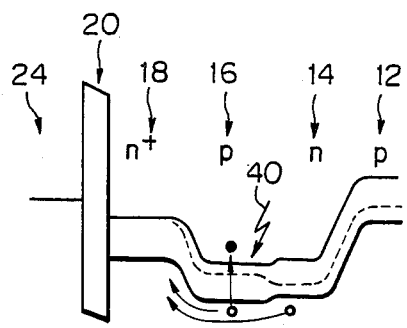

Referring to the timing chart of FIG. 5, during a period of time T2 for irradiating light to the photosensitive cell 10, if light 40 enters the pn junction region of the phototransistor Q through the opening 22, photocarriers are generated in the junction region, and electrons flow into the collector region of the phototransistor Q, namely, the source region 14 of the IGFET S, to be stored therein, while holes flow into the emitter region 18 of the phototransistor Q. To the emitter 18 connected is the capacitor C having the insulating layer 20 of a dielectric substance. As the intensity of incident light is lowered, the volume of photocarriers generated is decreased and thus the capacitor C is not saturated, that is, the emitter 18 of the transistor Q is coupled to the reference voltage $V_E$ by use of a sufficient capacitance. Consequently, electric charges associated with the generated photocarriers flow into the source region 14 to be stored therein. In this case, by virtue of the current amplification developed by the phototransistor Q, the electric charges resultant from multiplying the photocarriers flowing from the base 16 to the collector 14 by its amplification factor are stored in the source region 14, which is schematically shown in the energy band diagram of FIG. 7.

Figure 8:
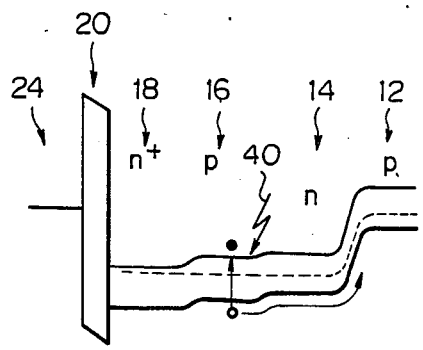

However, when a greater amount of incident light is irradiated, the volume of photocarriers generated is increased and the capacitor C is hence saturated. Then, the emitter 18 of the transistor Q is directly coupled to the power supply $V_E$. Consequently, the generated photocarriers are naturally fed to the source region 14 to be stored therein. That is, the current amplification of the phototransistor Q is suppressed, so that the phototransistor Q functions in the same manner as an ordinary photodiode. This operation is illustrated in the energy band diagram of FIG. 8 in which the emitter 18 is in its saturated state due to the stored electric charges, and the potential thereof is hence increased with respect to the holes, and thus the holes flow from the source 14 to the substrate 12.

During a period of time T3 for reading signals out as depicted in the timing chart of FIG. 5, if a pulse 304, FIG. 5, having the voltage $V_S$ is applied to the gate 30 of the IGFET S to open the gate 30, the stored electric charges can be read out in the form of signal current. As shown in FIG. 5, the signal current is delivered with a voltage which has a discrepancy 306 between the voltage at the drain electrode 34 and the reference voltage $V_{REF}$.

Figure 3:
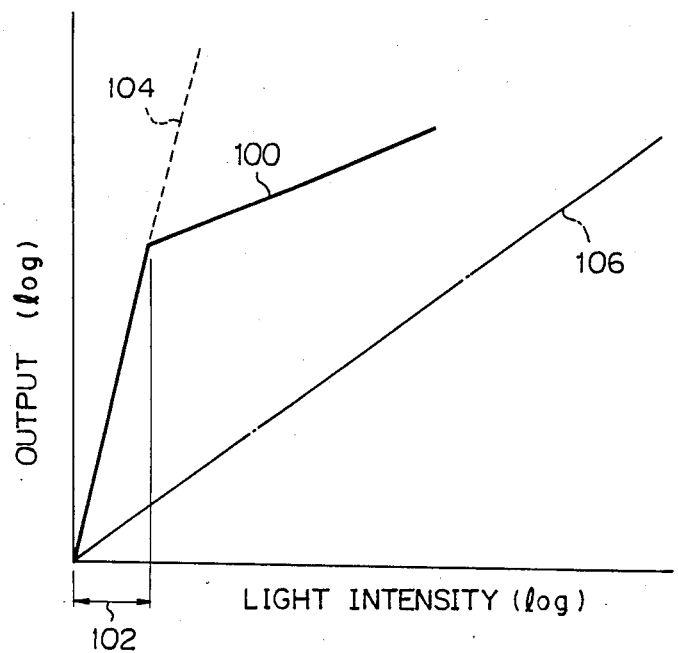
FIG. 3 is a graph plotting the output characteristic of the photosensitive cell of FIG. 1 with the ordinate and abscissa represented in logarithmic scale.

The output as illustrated with a solid line 100 in FIG. 3 abruptly increases as the intensity of the incident light becomes greater in a region 102 in which a relatively lower intensity of the incident light is irradiated, whereas the output gradually increases in the region in which a relatively higher intensity of the incident light is supplied. The prior art amplifying solid-state image pickup device described before develops an output characteristic in which, as shown with a dotted line 104, the output increases as the intensity of the incident light becomes higher with substantially the same sensitivity in the range of both lower and higher illumination intensity. Consequently, the saturated state takes place with a lower intensity of incident light. In addition, the prior art solid-state photosensitive cell not having an amplifying function develops a characteristic shown by a dot-and-dash line 106 in the figure, that is, it has a relatively lower sensitivity for the lower intensity of illumination.

Figure 6:
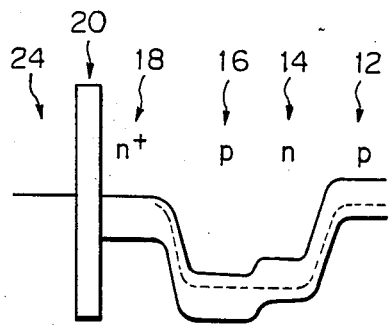
FIGS. 6–8 are energy band diagrams respectively illustrating a state in which the photosensitive cell of FIG. 1 is reset, a state in which the photocarriers generated by irradiating a light thereto are amplified, and a state in which a signal is generated in proportion to the photocarriers generated by the incident light.

In order to reset or initialize the photosensitive cell 10, during a period of time T1 in FIG. 5, the drain electrode terminal 34 is grounded and a pulse 300 having the positive voltage $V_S$ is applied to the gate electrode terminal 36, which then resets the collector 14, base 16, and emitter 18 to zero volts. Alternatively, it may be conducted to apply the voltage $V_{REF}$ to the drain electrode terminal 34, to ground the gate electrode terminal 36 and the terminal 26 of the capacitor C, and to irradiate light having a higher intensity of illumination to the pn junction region of the phototransistor Q for a short period of time, which then resets the collector 14, base 16, and emitter 18 to zero volts. The reset state is illustrated in the energy band diagram of FIG. 6.

After the photosensitive cell 10 is reset as described above, a pulse having the positive voltage $V_S$ is applied to the gate electrode terminal 36 immediately before the incident light 40 is irradiated, which then sets the source region, or collector region, 14 to the drain potential $V_{REF}$. The emitter region 18 is set to the ground potential $V_E$ due to the capacitive coupling by the capacitor C.

During the period of time T2 for irradiating the light 40, if the light 40 hits the pn junction region of the phototransistor Q through the opening 22, the photocarriers generated in the junction region flow into the collector region, or source region, 14 of the IGFET S to be stored therein as described before. If a pulse having the positive voltage $V_S$ is applied as a readout pulse to the gate terminal 36 of the IGFET S to open the gate 36, a signal current associated with the electric charges stored in the source region 14 flow through the channel of the IGFET S to be produced from the terminal 34.

Figure 4:
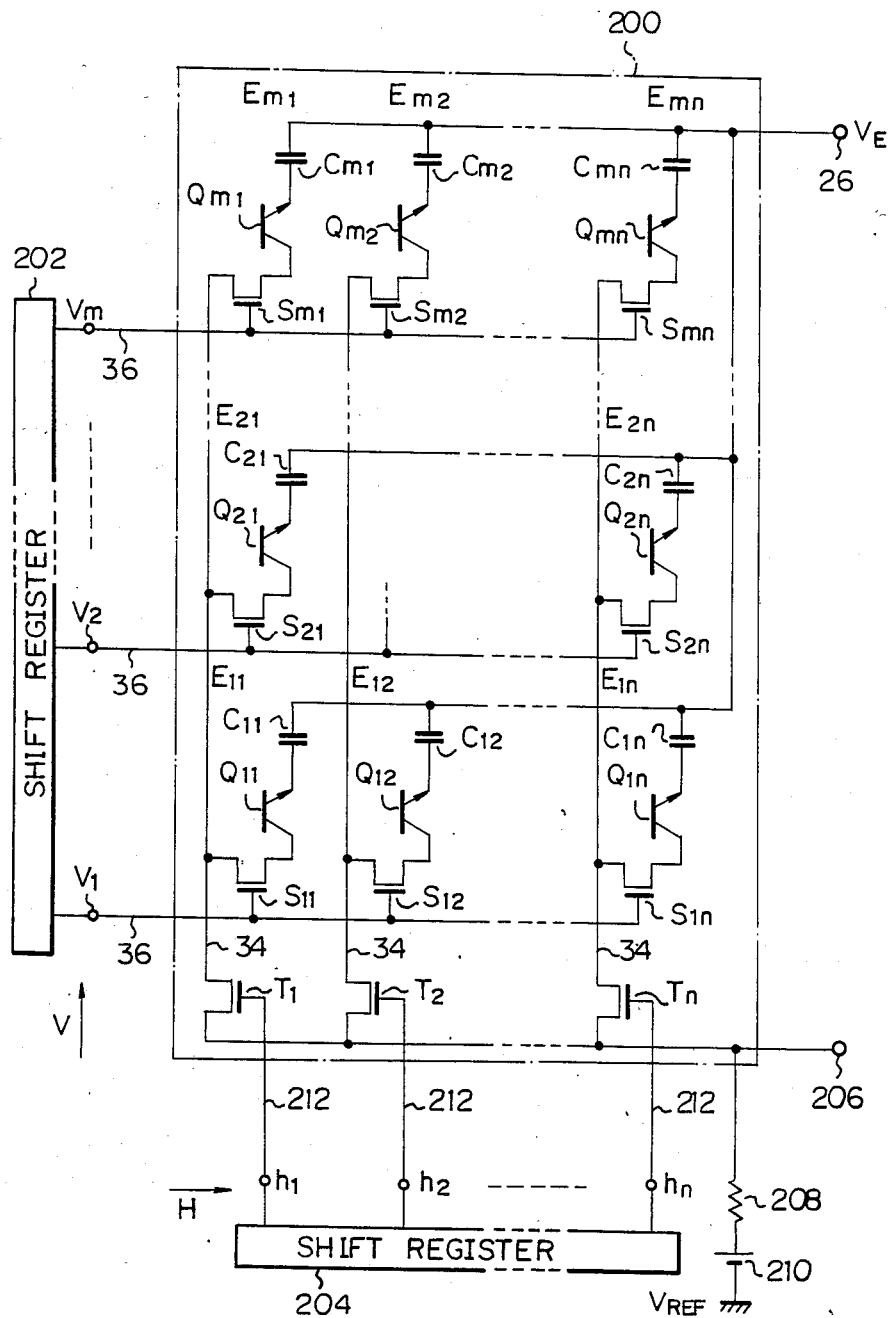
FIG. 4 is a schematic circuit diagram outlining an embodiment in which the present invention is applied to a solid-state image pickup device including a two-dimensional photosensitive cell array.

Referring to FIG. 4, there is provided an array of photosensitive cells 200 formed on the substrate 12 comprising the photosensitive cells of FIG. 1 located in an array of m horizontal rows and n vertical columns as designated E11-Emn. The terminal 26 of capacitors C11-Cmn of the photosensitive cells E11-Emn is commonly connected to be supplied with the reference voltage $V_E$. The gate terminal 36 of the IGFET S associated with the photosensitive cells E11-Emn is commonly connected for each of horizontal columns 1 to m, which are respectively supplied with outputs V1 to Vm from the associated stages of a horizontal row selecting shift register 202 for selecting a horizontal row.

Similarly, the drain terminal 34 of the IGFET S associated with the photosensitive cells E11-Emn is commonly connected for each of the vertical columns 1 to n and is linked to an output terminal 206 of this device through the source-drain path to the vertical column selecting gates T1-Tn. As illustrated in the figure, the output terminal 206 is connected via resistor 208 to a video power supply 210, which supplies the reference voltage $V_{REF}$. Gate electrodes 212 of the vertical column selecting gates T1-Tn are connected to outputs h1-hn of the associated stages of a vertical column selecting shift register 204.

After a light of an image is irradiated to the array of photosensitive cells 200, the stage of the shift register 202 for selecting a horizontal row is enabled to select a horizontal row, while the stages of the vertical column selecting shift register 204 are sequentially driven. This allows photosensitive cells E in a horizontal row to be scanned to read out the content thereof so that signals stored in photosensitive cells associated with the light of an image are serially delivered to the output terminal 206. By conducting this operation for respective horizontal rows, the signals of an image associated with a screen are read out.

As described above, in the image pickup device of the present invention, a capacitance is provided to the emitter, of the phototransistor so as to develop a function for amplifying an output signal in response to incident light for a relatively lower intensity of illumination and to suppress the amplifying function for a relatively higher intensity of illumination. Consequently, a broader dynamic range realizing so-called photographic characteristics is obtained in which sensitivity is higher with a lower illumination intensity and lower with a higher illumination intensity.

What is claimed is:

1. A solid-state image pickup device having photosensitive cells disposed on a semiconductor substrate of a first conductivity type, wherein said photosensitive cells are arranged in a principal surface of said semiconductor substrate, each of said photosensitive cells includes:
   phototransistor means for generating photocarriers associated with light incident thereto and storing the generated photocarriers therein;
   said phototransistor means including,
      a first region of semiconductor material of a second conductivity type which is opposite to the first conductivity type forming a collector electrode of said phototransistor means;
      a second region of semiconductor material of the first conductivity type disposed in said first region forming a base electrode of said phototransistor means; and
      a third region of semiconductor material of the second conductivity type disposed in said second region forming an emitter electrode of said phototransistor means;
   readout gate means connected to one electrode of said phototransistor means for reading out in the form of a video signal the photocarriers stored in said phototransistor means; and
   capacitor means disposed in said principal surface and connected to another electrode of said phototransistor means;
   said capacitor means including,
      a layer of insulating material disposed on said third region; and
      a layer of conductive material disposed on said layer of insulating material forming one electrode of said capacitor means;
      said third region also forming the other electrode of said capacitor means,
      said readout gate means including an IGFET in which said first region functions as either of source and drain electrodes thereof.

2. An image pickup device according to claim 1, wherein said layers of insulating material and conductive material are disposed in said principal surface so as to form an optical opening through which incident light passes to said phototransistor means.

3. An image pickup device according to claim 1, wherein said photosensitive cells are arranged in a two-dimensional array.

4. An image pickup device according to claim 1, wherein
   said semiconductor substrate is of p type silicon, the first region being of n type silicon, the second region being of p type silicon, the third region being of $n^+$ type silicon, so that the first, second and third regions form an npn phototransistor;
   said IGFET being of n channel type in which the first region functions as its source electrode.

5. A solid-state image pickup device having photosensitive cells disposed on a semiconductor substrate of a first conductivity type, wherein said photosensitive cells are arranged in a principal surface of said semiconductor substrate, each of said photosensitive cells includes:
   phototransistor means having at least first and second electrodes, for generating photocarriers associated with light incident thereto and storing the generated photocarriers therein;
   readout gate means connected to one electrode of said phototransistor means for reading out in the form of a video signal the photocarriers stored in said phototransistor means; and
   capacitor means disposed in said principal surface and connected to the other electrode of said phototransistor means;
   said capacitor means having a capacitance which is saturated by the photocarriers excited from a relatively high intensity incident light in said phototransistor means so as to permit said phototransistor means to function as a photodiode.

6. An image pickup device according to claim 5, wherein said phototransistor means includes:
   a first region of semiconductor material of a second conductivity type which is opposite to the first conductivity type forming a collector electrode of said phototransistor means;

a second region of semiconductor material of the first conductivity type disposed in said first region forming a base electrode of said phototransistor means; and a third region of semiconductor material of the second conductivity type disposed in said second region forming an emitter electrode of said phototransistor means;

said capacitor means including, a layer of insulating material disposed on said third region; and a layer of conductive material disposed on said layer of insulating material forming one electrode of said capacitor means;

said third region also forming the other electrode of said capacitor means;

said readout gate means including an IGFET in which said first region functions as either of source and drain electrodes thereof.

7. An image pickup device according to claim 5, wherein said photosensitive cells are arranged in a two-dimensional array.

8. An image pickup device according to claim 6, wherein said semiconductor substrate is of p type silicon, the first region being of n type silicon, the second region being of p type silicon, the third region being of n+type silicon, so that the first, second and third regions form an npn phototransistor;

said IGFET being of n channel type in which the first region functions as its source electrode.

9. An image pickup device according to claim 5, wherein said layers of insulating material and conductive material are disposed in said principal surface so as to form an optical opening through which incident light passes to said phototransistor means.

* * * * *